United States Patent
Fujii et al.

(10) Patent No.: US 8,450,183 B2
(45) Date of Patent: May 28, 2013

(54) POWER SEMICONDUCTOR DEVICE AND METHOD OF MANUFACTURING THE SAME

(75) Inventors: Ryoichi Fujii, Tokyo (JP); Shigeto Honda, Tokyo (JP); Atsushi Narazaki, Tokyo (JP); Kaoru Motonami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 282 days.

(21) Appl. No.: 12/961,905

(22) Filed: Dec. 7, 2010

(65) Prior Publication Data

US 2011/0220914 A1 Sep. 15, 2011

(30) Foreign Application Priority Data

Mar. 10, 2010 (JP) ................................. 2010-052606

(51) Int. Cl.
*H01L 21/76* (2006.01)
*H01L 31/0312* (2006.01)
*H01L 23/58* (2006.01)

(52) U.S. Cl.
USPC ...... 438/437; 257/77; 257/493; 257/E21.214; 257/E29.166

(58) Field of Classification Search
USPC ..................... 438/437; 257/77, 493, E21.214, 257/E29.166
See application file for complete search history.

(56) References Cited

U.S. PATENT DOCUMENTS

| | | | |
|---|---|---|---|
| 5,949,130 A | 9/1999 | Fukuyama et al. | |
| 6,133,587 A | 10/2000 | Takeuchi et al. | |
| 6,566,224 B1 | 5/2003 | Chang et al. | |
| 2002/0142564 A1 | 10/2002 | Kumamoto | |
| 2003/0102562 A1 | 6/2003 | Tomita | |
| 2005/0170661 A1 | 8/2005 | Economikos et al. | |
| 2005/0184355 A1 | 8/2005 | Okada | |
| 2005/0206006 A1 | 9/2005 | Tomita | |
| 2007/0155104 A1 | 7/2007 | Marchant et al. | |
| 2008/0283961 A1 | 11/2008 | Tomita | |
| 2009/0072345 A1 | 3/2009 | Tomita | |

(Continued)

FOREIGN PATENT DOCUMENTS

| | | |
|---|---|---|
| CN | 1257608 A | 6/2000 |
| CN | 1661808 A | 8/2005 |

(Continued)

OTHER PUBLICATIONS

Office Action issued Jul. 11, 2012 in Korean Patent Application No. 10-2011-0020182 (with partial English translation and Japanese translation. The partial English translation is made on the basis of a Japanese translation of the Office Action).

(Continued)

*Primary Examiner* — David S Blum
(74) *Attorney, Agent, or Firm* — Oblon, Spivak, McClelland, Maier & Neustadt, L.L.P.

(57) ABSTRACT

A method of manufacturing a power semiconductor device according to the present invention includes the steps of: (a) forming a silicon nitride film on a semiconductor substrate; (b) after the step (a), forming a ring-shaped trench along a peripheral portion of the semiconductor substrate 6; (c) forming a first silicon oxide film on an inner surface of the trench; (d) after the step (c), forming a second silicon oxide film on an entire surface of the semiconductor substrate to bury the trench; (e) planarizing the second silicon oxide film by using the silicon nitride film as a stopper; and (f) forming a third silicon oxide film in a region in which the silicon nitride film is removed.

5 Claims, 8 Drawing Sheets

U.S. PATENT DOCUMENTS

| | | |
|---|---|---|
| 2009/0072346 A1 | 3/2009 | Tomita |
| 2009/0085116 A1 | 4/2009 | Aoki |
| 2009/0325361 A1 | 12/2009 | Mauder et al. |
| 2011/0012224 A1 | 1/2011 | Tomita |
| 2011/0012225 A1 | 1/2011 | Tomita |

FOREIGN PATENT DOCUMENTS

| | | |
|---|---|---|
| CN | 101404282 A | 4/2009 |
| DE | 10 2009 027 008 A1 | 1/2010 |
| JP | 11-97523 | 4/1999 |
| JP | 2002-289683 | 10/2002 |
| JP | 2005-243717 | 9/2005 |
| JP | 2009-21526 | 1/2009 |
| JP | 2009-64970 | 3/2009 |
| JP | 2009-88385 | 4/2009 |
| KR | 2001-0060349 | 7/2001 |
| KR | 10-2006-0063304 A | 6/2006 |

OTHER PUBLICATIONS

Office Action issued Jul. 24, 2012 in German Patent Application No. 10 2011 005 210.0 with English language translation.

Combined Chinese Office Action and Search Report issued Dec. 11, 2012 in Chinese Patent Application No. 201110001689.6 (with partial English-language translation).

F I G . 1
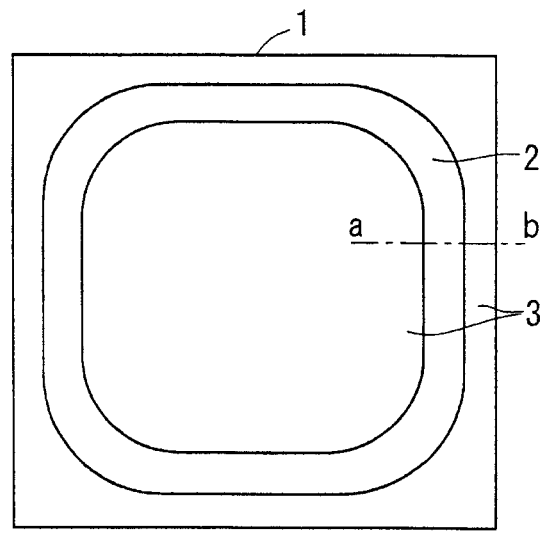
F I G . 2
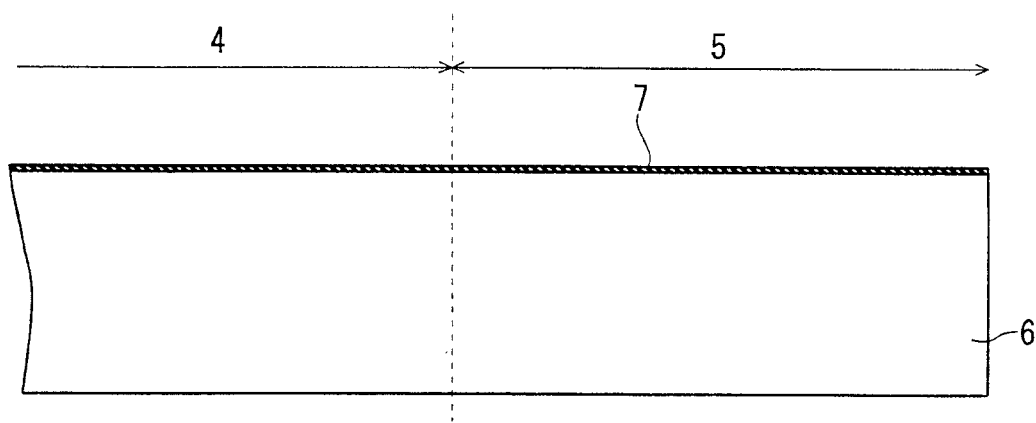

POWER SEMICONDUCTOR DEVICE AND METHOD OF MANUFACTURING THE SAME

BACKGROUND OF THE INVENTION

1. Field of the Invention

The present invention relates to a structure of and a method of manufacturing a power semiconductor device such as a diode which performs rectification by a PN junction formed on a semiconductor substrate, or a MOS field effect transistor (MOSFET) or an Insulated Gate Bipolar Transistor (IGBT) which controls a main current by applying voltage to a gate formed on a semiconductor substrate with interposition of an insulating film.

2. Description of the Background Art

A power semiconductor device is constituted by a cell region in which a current flows and a terminal region formed around the cell region to maintain a breakdown voltage. As a terminal region structure, for example, a RESURF (Reduced Surface Field) structure is adopted. In the RESURF structure, a breakdown voltage is maintained by extending a depletion layer by a RESURF layer when a reverse voltage is applied. Here, a thick insulating film is necessary on a surface of the RESURF layer, in order to maintain the breakdown voltage. Presence of this thick insulating film causes a large level difference on a substrate, which makes it difficult to perform a process in subsequent steps such as application of a resist in a photoengraving step. Thus, a method of burying an insulating film in a substrate has been proposed, for example, in Japanese Patent Application Laid-Open No. 2009-88385. According to Japanese Patent Application Laid-Open No. 2009-88385, after implantation for forming a RESURF layer is performed in a terminal region, a trench is formed and an insulating film is buried therein, and then an unnecessary part is planarized by chemical mechanical polishing (CMP), thereby forming a thick insulating film on the RESURF layer, so that occurrence of a level difference is suppressed.

In the conventional inventions, when the insulating film buried after the formation of the trench is planarized by the CMP, an end point of the planarization is not defined. For example, when a silicon oxide film is used as the insulating film, if the planarization using the CMP is stopped before the substrate is exposed so that the silicon oxide film on the substrate remains over an entire surface of a wafer, damage to the substrate due to over-polishing can be prevented, but a variation of the thickness of the silicon oxide film within a wafer plane or within a chip is large. If the variation of the thickness of the silicon oxide film causes color unevenness in a surface of the substrate, an abnormality check based on an external appearance is impossible. Moreover, in a subsequent step of forming an electrode in a cell region, it is necessary to remove the silicon oxide film in the cell region by wet/dry etching. Here, a problem arises that the controllability of the etching amount deteriorates due to the variation of the thickness of the silicon oxide film.

On the other hand, if the planarization using the CMP is performed until the surface of the substrate is exposed so that the silicon oxide film on the surface of the substrate is wholly removed over the entire surface of the wafer, the variation of the thickness of the silicon oxide film on the substrate does not occur, but damage to the substrate due to over-polishing occurs. Occurrence of the damage to the substrate leads to a deterioration of electrical characteristics, such as occurrence of current leakage from a surface to a back surface of the substrate.

SUMMARY OF THE INVENTION

An object of the present invention is to provide a method of manufacturing a power semiconductor device capable of forming a RESURF structure by burying an insulating film in a semiconductor substrate without causing a variation of the thickness of the insulating film and damage to the substrate, and also to provide a power semiconductor device manufactured by the manufacturing method.

A method of manufacturing a power semiconductor device according to the present invention includes the steps of: (a) forming a silicon nitride film on a semiconductor substrate; (b) after the step (a), forming a ring-shaped trench along a peripheral portion of the semiconductor substrate as a terminal structure of a cell region, and defining the inside of the ring as the cell region; (c) forming a first silicon oxide film on an inner surface of the trench; (d) after the step (c), forming a second silicon oxide film on an entire surface of the semiconductor substrate to bury the trench; (e) planarizing the second silicon oxide film by using the silicon nitride film as a stopper; and (f) removing the silicon nitride film, and then forming a third silicon oxide film in a region in which the silicon nitride film is removed.

Since the trench is formed in the step (b) after the silicon nitride film is formed on the semiconductor substrate in the step (a), the inner surface of the trench is not covered with the silicon nitride film. Instead, the first silicon oxide film is formed on the inner surface of the trench in the step (c), to thereby fix an interface charge of the inner surface of the trench.

Additionally, in the step (e), the second silicon oxide film is planarized so as not to remain on the semiconductor substrate, which can prevent a deterioration of a process controllability and a variation of electrical characteristics which are caused by a variation of the thickness of the silicon oxide film. Moreover, since the silicon nitride film serves as the stopper, the surface of the semiconductor substrate is not directly polished, and damage to the semiconductor substrate can be avoided.

Furthermore, by forming the silicon oxide film instead of the silicon nitride film in the step (f), the interface charge of the surface of the semiconductor substrate is fixed.

A power semiconductor device according to the present invention includes a semiconductor substrate, a first silicon oxide film, a second silicon oxide film, and the third silicon oxide film. A ring-shaped trench is formed along a peripheral portion of the semiconductor substrate as a terminal structure of a cell region, the inside of the ring being is as the cell region. The first silicon oxide film is formed on an inner surface of the trench. The second silicon oxide film is formed on the first silicon oxide film and buried in the trench. The third silicon oxide film is formed on a surface of the semiconductor substrate except the trench. The trench is formed as a trench part in which the surface of the semiconductor substrate is scattered in the shape of islands.

The trench is formed as a trench part in which the surface of the semiconductor substrate is scattered in the shape of islands. Thereby, in the step of burying the second silicon oxide film 13 in the trench 2, over-polishing of the silicon oxide film 13 existing within the trench 2 can be prevented.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a configuration of a power semiconductor device according to a preferred embodiment 1;

FIG. 2 is a cross-sectional view showing a manufacturing step of the power semiconductor device according to the preferred embodiment 1;

DESCRIPTION OF THE PREFERRED EMBODIMENTS (Preferred Embodiment 1)
<Configuration>

Figure 15:
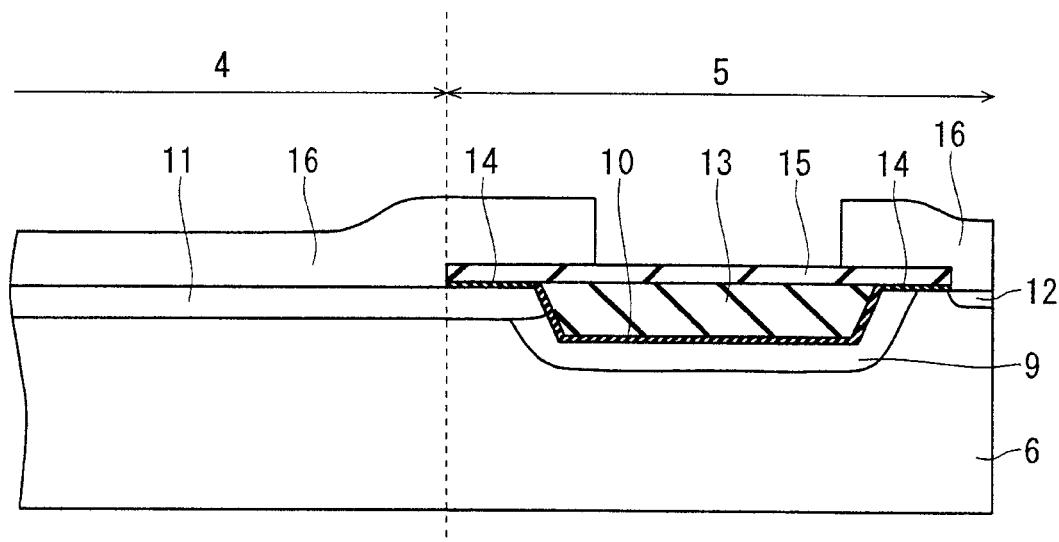
FIG. 15 is a cross-sectional view showing a manufacturing step of the power semiconductor device according to the preferred embodiment 1.

In a power semiconductor device of this preferred embodiment, as shown in FIG. 1, a ring-shaped trench 2 is formed in a terminal region extending along a peripheral portion of a chip (semiconductor substrate) 1, and the inside of the trench 2 is defined as a cell region. FIG. 15 is a cross-sectional view showing a configuration of the power semiconductor device of this preferred embodiment, as taken along the line a-b of FIG. 1.

As shown in FIG. 15, the power semiconductor device of this preferred embodiment includes an n-type silicon substrate 6, the trench 2 formed in a terminal region 5 of the silicon substrate 6, a p-type RESURF layer 9 formed under the trench 2, an n-type channel stopper layer 12 formed on a silicon substrate surface 3 at the outer side of the RESURF layer 9, a silicon oxide film 10 formed on an inside wall of the trench 2, a silicon oxide film 13 buried in the trench 2 and arranged at the upper side of the silicon oxide film 10, and a silicon oxide film 14 formed on a part of a surface of the silicon substrate 6 outside the trench 2. Additionally, the power semiconductor device includes a silicon oxide film 15 formed over the trench 2 and serving as an interlayer insulating film, a p-type base layer 11 formed on a part of the surface of the silicon substrate 6 in a cell region 4, and an aluminum-silicon layer 16 formed over the base layer 11 and the silicon oxide film 15.

The present invention relates to a method of manufacturing a power semiconductor device having such a RESURF structure without causing damage to the silicon substrate 6 and unevenness of the thickness of the silicon oxide films in the course of burying the silicon oxide film 13 in the trench 2, and also relates to a structure of the power semiconductor device.

<Manufacturing Process>

A manufacturing process of the power semiconductor device of this preferred embodiment will be described with reference to FIGS. 2 to 15 which are cross-sectional views taken along the line a-b of FIG. 1.

Figure 3:
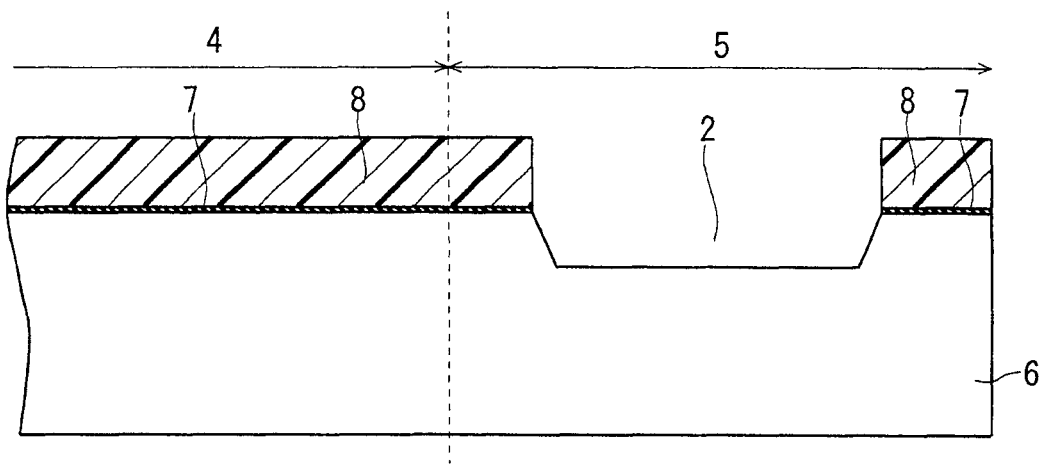
FIG. 3 is a cross-sectional view showing a manufacturing step of the power semiconductor device according to the preferred embodiment 1.

Firstly, a silicon nitride film 7 having a thickness of 100 nm is formed on an entire surface of a wafer (silicon substrate 6) (FIG. 2). The film is formed by chemical vapor deposition (CVD). In order to form the ring-shaped trench 2 shown in FIG. 1 in the terminal region 5 of the outer peripheral portion of the chip, a resist 8 is applied to the surface of the silicon substrate 6, and a photoengraving process is performed, to form a ring-shaped opening in the resist 8. The silicon nitride film 7 existing in an opening portion of the resist 8 is removed by dry etching, and the trench 2 is formed in the silicon substrate 6 (FIG. 3). The depth of the trench 2 is 2 μm.

Figure 4:
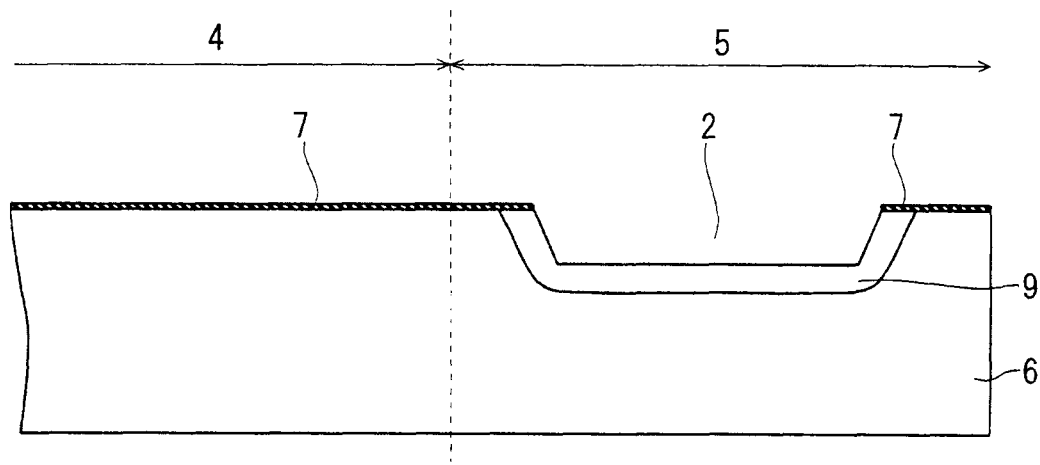
FIG. 4 is a cross-sectional view showing a manufacturing step of the power semiconductor device according to the preferred embodiment 1.
Figure 5:
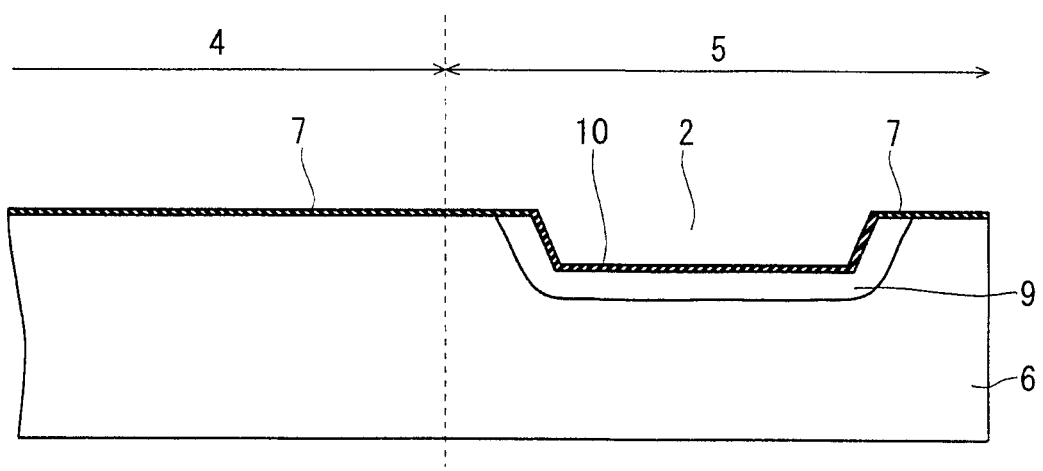
FIG. 5 is a cross-sectional view showing a manufacturing step of the power semiconductor device according to the preferred embodiment 1.

After the trench 2 is formed, boron is implanted by using the same resist 8, to form the p-type RESURF layer 9 on the side surface and the bottom surface of the trench 2 (FIG. 4). The resist 8 is removed, and then thermal oxidation is performed, to form the silicon oxide film 10 having a thickness of 100 nm on the inside wall of the trench 2 (FIG. 5). Due to the silicon oxide film 10, an interface charge of the inside wall of the trench 2 is fixed.

Figure 6:
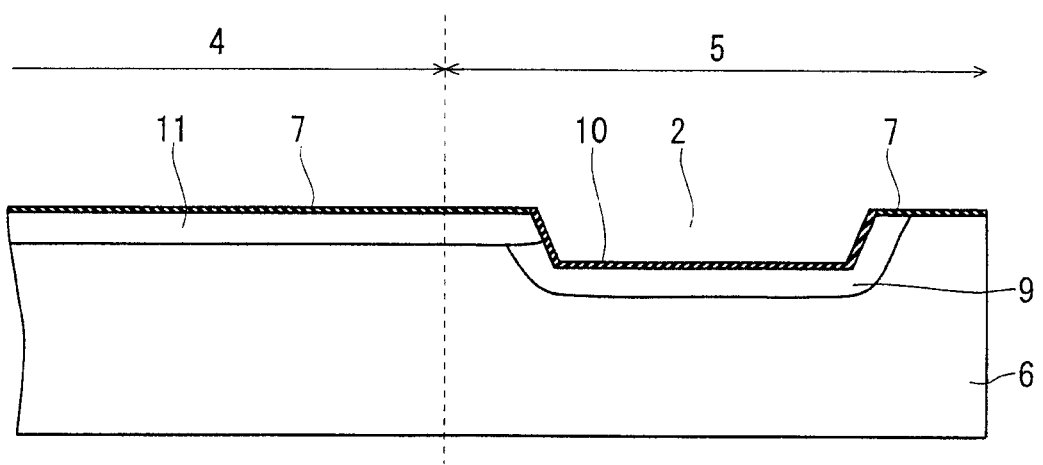
FIG. 6 is a cross-sectional view showing a manufacturing step of the power semiconductor device according to the preferred embodiment 1.
Figure 7:
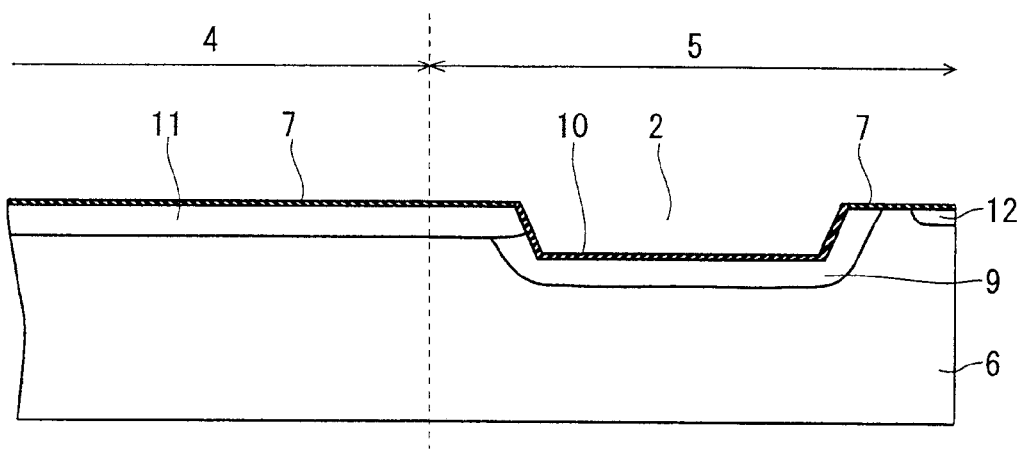
FIG. 7 is a cross-sectional view showing a manufacturing step of the power semiconductor device according to the preferred embodiment 1.
Figure 8:
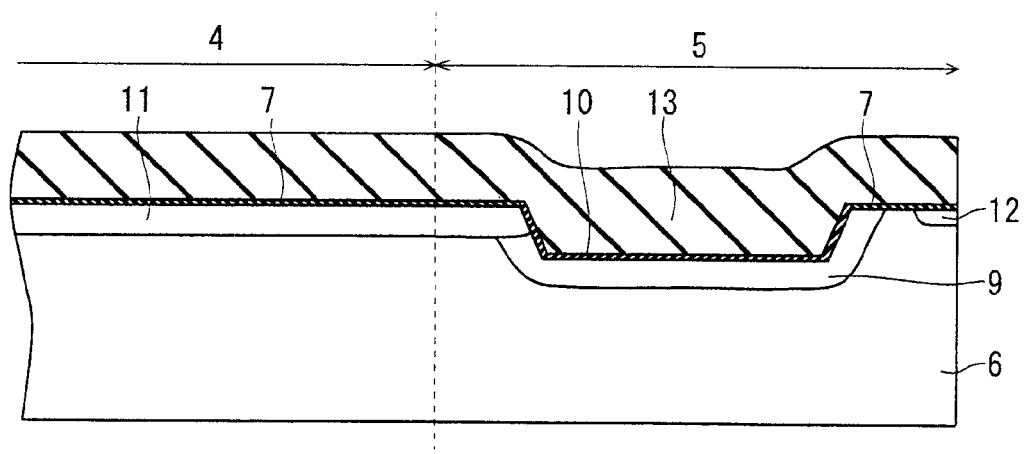
FIG. 8 is a cross-sectional view showing a manufacturing step of the power semiconductor device according to the preferred embodiment 1.

Then, a photoengraving process is performed to form an opening in a resist of the cell region 4. Boron is implanted, and then the resist is removed. The implanted boron is thermally diffused, to form the p-type base layer 11 (FIG. 6). After the base layer 11 is formed, a photoengraving process is performed to form an opening in a resist existing at the outer side of the ring-shaped trench 2. Arsenic is implanted, and then the resist is removed. The implanted arsenic is thermally diffused, to form the channel stopper layer 12 (FIG. 7). After the channel stopper layer 12 is formed, in order to bury the trench 2, the silicon oxide film 13 is deposited 2.5 μm thick on the entire surface of the wafer by CVD (FIG. 8).

Figure 9:
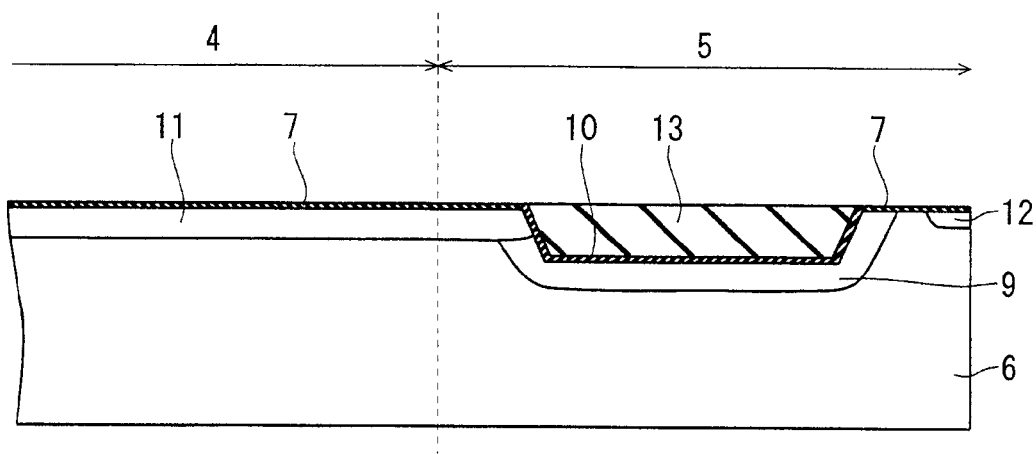
FIG. 9 is a cross-sectional view showing a manufacturing step of the power semiconductor device according to the preferred embodiment 1.
Figure 10:
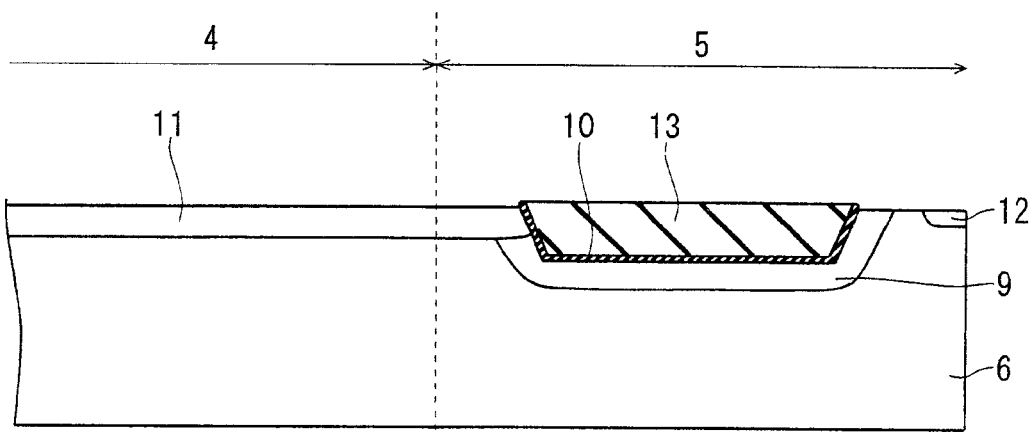
FIG. 10 is a cross-sectional view showing a manufacturing step of the power semiconductor device according to the preferred embodiment 1.
Figure 11:
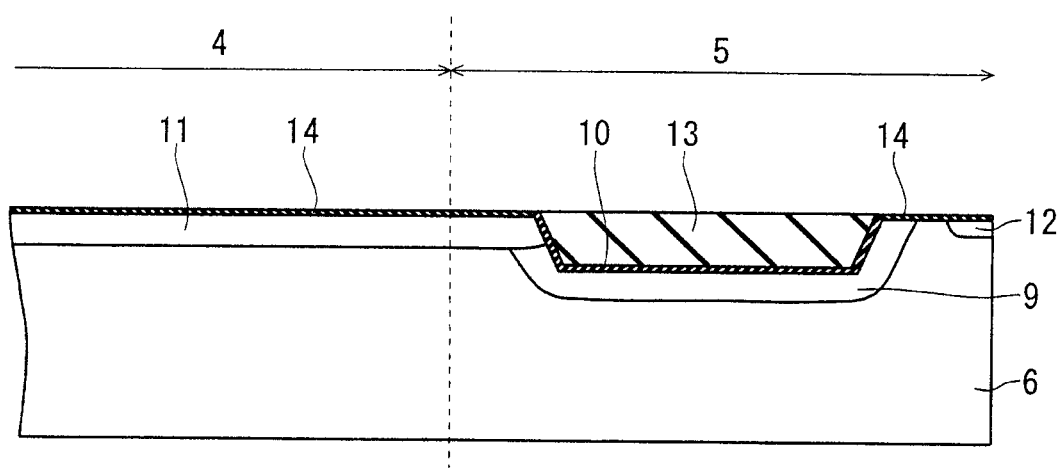
FIG. 11 is a cross-sectional view showing a manufacturing step of the power semiconductor device according to the preferred embodiment 1.

The level of the silicon oxide film 13 differs between a trench region and the other regions. To resolve this level difference, planarization by CMP is performed. The silicon nitride film 7 is used as a stopper for the CMP, and the CMP is completed when the silicon nitride film 7 is exposed (FIG. 9). The silicon nitride film 7 exposed as a result of the CMP is removed using hot phosphoric acid, to expose the silicon substrate 6 (FIG. 10). By thermal oxidation, the silicon oxide film 14 having a thickness of 100 nm is formed on the surface of the silicon substrate 6 (FIG. 11). The silicon oxide film 14 fixes the interface charge of the surface of the silicon substrate 6 in the cell region 4. Then, a gate electrode and the like are formed in the cell region 4, though not shown.

Figure 12:
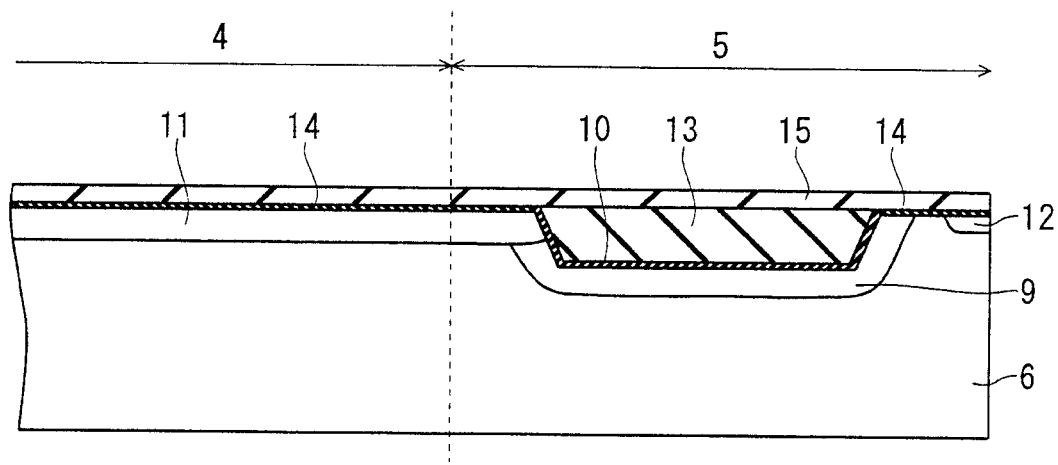
FIG. 12 is a cross-sectional view showing a manufacturing step of the power semiconductor device according to the preferred embodiment 1.
Figure 13:
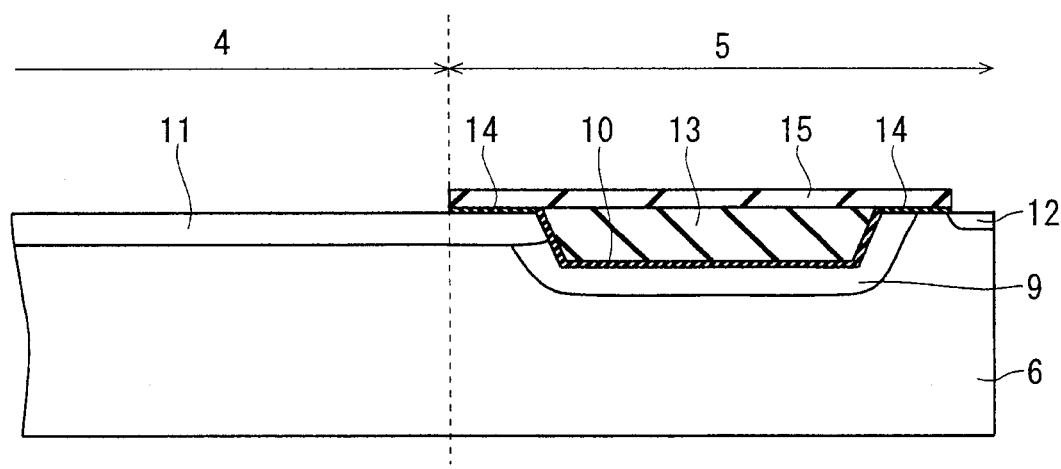
FIG. 13 is a cross-sectional view showing a manufacturing step of the power semiconductor device according to the preferred embodiment 1.
Figure 14:
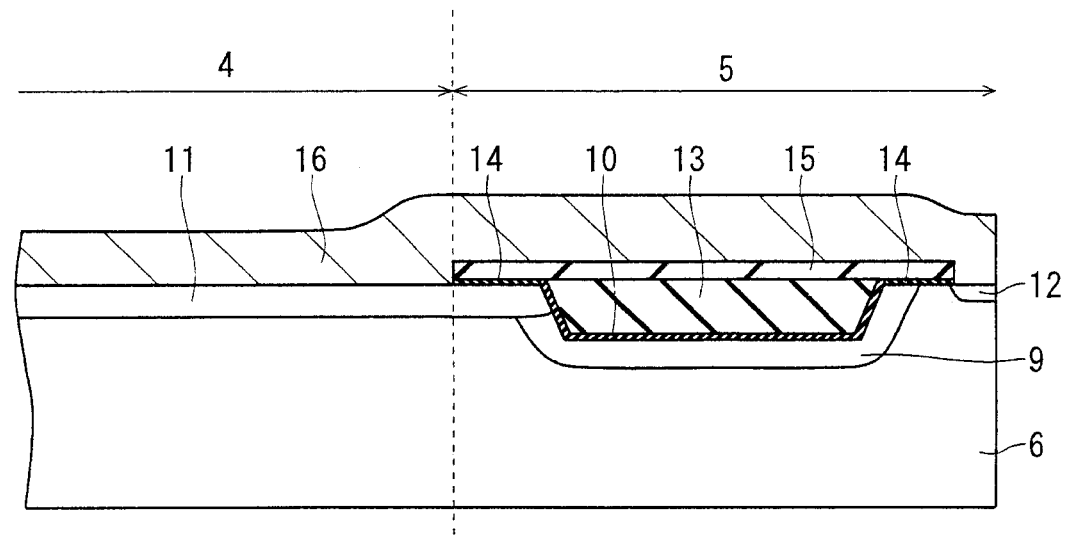
FIG. 14 is a cross-sectional view showing a manufacturing step of the power semiconductor device according to the preferred embodiment 1.

Subsequently, the silicon oxide film 15 is deposited 1 μm thick on the entire surface of the wafer (FIG. 12). Then, a photoengraving process is performed, to form openings in a resist at portions thereof above required parts in the cell region 4 and above the channel stopper layer 12. The silicon oxide film 15 is removed by wet etching, to expose the base layer 11 and the channel stopper layer 12 (FIG. 13). Then, the aluminum-silicon layer 16 is deposited 4 µm thick on the entire surface of the wafer (FIG. 14). Subsequently, a photoengraving process is performed, to form an opening in a resist at a portion thereof corresponding to a central portion of the silicon oxide film 14 in the terminal region 5. The aluminum-silicon layer 16 existing in the opening portion is removed by dry etching. Thereby, the base layer 11 and the channel stopper layer 12 are insulated from each other (FIG. 15). Moreover, film thinning is performed on the back surface, and an n-type buffer layer and an electrode structure are formed. Thus, a diode is completed.

As described above, the method of manufacturing the power semiconductor device according to this preferred embodiment includes the steps of: (a) forming the silicon nitride film 7 on the semiconductor substrate 6; (b) after the step (a), forming the ring-shaped trench 2 along the peripheral portion of the semiconductor substrate 6 as a terminal structure of a cell region, and defining the inside of the ring as the cell region; (c) forming the first silicon oxide film 10 on the inner surface of the trench 2; (d) after the step (c), forming the second silicon oxide film 13 on the entire surface of the semiconductor substrate 6 to bury the trench 2; (e) planarizing the second silicon oxide film 13 by using the silicon nitride film 7 as a stopper; and (f) removing the silicon nitride film 7, and then forming the third silicon oxide film 14 in a region in which the silicon nitride film 7 is removed. By adopting the above-described method to manufacture a diode having a terminal region of a RESURF structure in which an insulating film is buried in the substrate, when the silicon oxide film 13 which has been deposited on the entire surface of the wafer for burying the trench 2 is planarized by the CMP, the silicon oxide film 13 does not remain on the silicon substrate 6 except the region where the trench 2 is formed. This can prevent a deterioration of the process controllability and a variation of electrical characteristics due to a variation of the thickness of the silicon oxide film which may occur when the silicon oxide film 13 is not completely removed. Additionally, since the silicon nitride film 7 serves as the stopper for the CMP, the surface of the substrate is prevented from being directly polished, and damage to the substrate can be avoided. If the inside wall of the trench 2 is covered with the silicon nitride film 7, the interface charge is not fixed and the electrical characteristics may deteriorate. However, since the silicon nitride film 7 is formed not after but before the formation of the trench 2, the silicon nitride film 7 does not exist at the inside wall of the trench 2. Moreover, since the silicon oxide film 10 is formed at the inside wall of the trench 2 by the thermal oxidation, the interface charge can be fixed. Furthermore, the silicon nitride film 7 on the silicon substrate 6 which is used as the stopper for the CMP is removed after the CMP, and the silicon oxide film 14 is formed in the region in which the silicon nitride film 7 is removed, by the thermal oxidation similarly to the inside wall of the trench 2. Thereby, the interface charge is fixed, and a deterioration of the electrical characteristics due to the interface charge can be suppressed.

Although the silicon substrate 6 is adopted in the above description, the manufacturing method of the present invention is also applicable to an SiC substrate. Moreover, the manufacturing method of the present invention is applicable to a power semiconductor having a terminal region such as not only a diode but also a MOSFET and an IGBT. Parameters, such as the thickness of a film being formed, the position of a diffusion layer with respect to a plane direction and a depth direction, the order of the formation of diffusion layers, a structure on the silicon oxide film, are changeable.

<Effect>

The method of manufacturing the power semiconductor device according to this preferred embodiment exerts the following effects, as already stated. The method of manufacturing the power semiconductor device according to this preferred embodiment includes the steps of: (a) forming the silicon nitride film 7 on the semiconductor substrate 6; (b) after the step (a), forming the ring-shaped trench 2 along the peripheral portion of the semiconductor substrate 6 as a terminal structure of a cell region, and defining the inside of the ring as the cell region; (c) forming the first silicon oxide film 10 on the inner surface of the trench 2; (d) after the step (c), forming the second silicon oxide film 13 on the entire surface of the semiconductor substrate 6 to bury the trench 2; (e) planarizing the second silicon oxide film 13 by using the silicon nitride film 7 as a stopper; and (f) removing the silicon nitride film 7, and then forming the third silicon oxide film 14 in a region in which the silicon nitride film 7 is removed. By adopting the above-described method to manufacture a diode having a terminal region of a RESURF structure in which an insulating film is buried in the substrate, when the silicon oxide film 13 which has been deposited on the entire surface of the wafer for burying the trench 2 is planarized by the CMP, the silicon oxide film 13 does not remain on the silicon substrate 6 except the region where the trench 2 is formed. This can prevent a deterioration of the process controllability and a variation of electrical characteristics due to a variation of the thickness of the silicon oxide film which may occur when the silicon oxide film 13 is not completely removed. Additionally, since the silicon nitride film 7 serves as the stopper for the CMP, the surface of the substrate is prevented from being directly polished, and damage to the substrate can be avoided. If the inside wall of the trench 2 is covered with the silicon nitride film 7, the interface charge is not fixed and the electrical characteristics may deteriorate. However, since the silicon nitride film 7 is formed not after but before the formation of the trench 2, the silicon nitride film 7 does not exist at the inside wall of the trench 2. Moreover, since the silicon oxide film 10 is formed at the inside wall of the trench 2 by the thermal oxidation, the interface charge can be fixed. Furthermore, the silicon nitride film 7 on the silicon substrate 6 which is used as the stopper for the CMP is removed after the CMP, and the silicon oxide film 14 is formed in the region in which the silicon nitride film 7 is removed, by the thermal oxidation similarly to the inside wall of the trench 2. Thereby, the interface charge is fixed, and a deterioration of the electrical characteristics due to the interface charge can be suppressed.

In the step (a), the silicon nitride film is formed on an Si substrate or an SiC substrate serving as the semiconductor substrate. Use of either of the Si substrate and the SiC substrate can exert the effects of the invention described above.

(Preferred Embodiment 2)

<Configuration>

In the manufacturing process of the power semiconductor device according to the preferred embodiment 1, when the planarization by the CMP is performed, the surface of the silicon substrate 6 in the region where the trench 2 is not formed is covered with the silicon nitride film 7, which therefore serves as the stopper for stopping the CMP and to prevent the surface of the silicon substrate 6 from being ground. On the other hand, there is no silicon nitride film 7 in the trench 2 formed in the terminal region 5, and the trench 2 is buried in the silicon oxide film 13. Therefore, if the planarization by the CMP is performed for a long time until the silicon nitride film 7 on the surface of the silicon substrate 6 is completely exposed, the silicon oxide film 13 in the trench 2 may be ground by over-polishing so that the thickness of the insulating film on the RESURF layer 9 is reduced, which may deteriorate the electrical characteristics.

Figure 16:
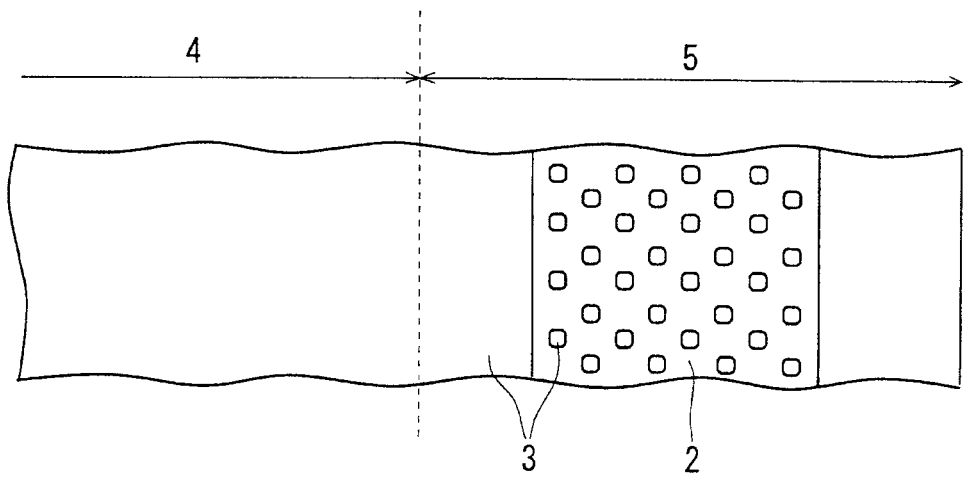
FIG. 16 is a plan view showing a configuration of a power semiconductor device according to a preferred embodiment 2.

To solve this problem, in a power semiconductor device according to a preferred embodiment 2, the surface of the semiconductor substrate 6 is left in the shape of islands, within the ring-shaped trench 2 of the power semiconductor device according to the preferred embodiment 1. FIG. 16 is a plan view showing a state where the trench 2 is formed in the silicon substrate 6 in the power semiconductor device according to this preferred embodiment. The island-shaped portion of the surface of the silicon substrate 6 left within the trench 2 may have a square shape as shown in FIG. 16, or other various shapes such as circular shapes and polygonal shapes. Except for this point, the configuration as that of the power semiconductor device of the preferred embodiment 1 is adopted, and thus a description thereof is omitted.

The power semiconductor device according to this preferred embodiment includes the semiconductor substrate 6. The ring-shaped trench 2 is formed along the peripheral portion of the semiconductor substrate 6 as a terminal structure of a cell region, and the inside of the ring is defined as the cell region. The power semiconductor device further includes the first silicon oxide film 10 formed on the inner surface of the trench 2, the second silicon oxide film 13 formed on the first silicon oxide film 10 and buried in the trench 2, and the third silicon oxide film 14 formed on the surface of the semiconductor substrate 6 except the region of the trench 2. The trench 2 is formed as a trench part in which the surface of the semiconductor substrate 6 is scattered in the shape of islands.

<Manufacturing Step>

Next, a manufacturing process of the power semiconductor device according to this preferred embodiment will be described.

Firstly, the silicon nitride film 7 having a thickness of 100 nm is formed on the entire surface of the wafer (silicon substrate 6) (FIG. 2). The film is formed by CVD. In order to form the ring-shaped trench 2 shown in FIG. 1 in the terminal region 5 of the outer peripheral portion of the chip, a resist 8 is applied to the surface of the silicon substrate 6, and a photoengraving process is performed, to form a ring-shaped opening in the resist 8. At that time the opening is not formed at portions in the ring-shaped region, the portion having the shape of islands. Then, the silicon nitride film 7 existing in an opening portion of the resist 8 is removed by dry etching, and the trench 2 is formed in the silicon substrate 6 (which is the same as shown in FIG. 3, but different from FIG. 3 in that the silicon substrate surface 3 is left in an island-like manner). The depth of the trench 2 is 2 µm. In this manner, the trench 2 in which the silicon substrate surface 3 is left in the shape of islands is formed (FIG. 16). The silicon nitride film 7 is formed on the silicon substrate surface 3. The subsequent steps are the same as in the preferred embodiment 1, and thus a description thereof is omitted.

Since the silicon substrate surface 3 is left in the shape of islands within the trench 2 in this manner, in the step of performing the planarization by the CMP so that the silicon oxide film 13 formed on the entire surface of the wafer is left only within the trench 2 (see FIGS. 8 and 9), the silicon nitride film 7 formed on the parts of the silicon substrate surface 3 within the trench 2 serves as the stopper to prevent the silicon oxide film 13 existing within the trench 2 from being over-polished.

An SiC substrate may be used instead of the silicon substrate 6. Moreover, the manufacturing method of the present invention is applicable to a power semiconductor having a terminal region such as not only a diode but also a MOSFET and an IGBT.

<Effect>

The method of manufacturing the power semiconductor device according to this preferred embodiment exerts the following effects. The method of manufacturing the power semiconductor device according to this preferred embodiment includes the steps of: (a) forming the silicon nitride film 7 on the semiconductor substrate 6; (b) after the step (a), forming the ring-shaped trench 2 along the peripheral portion of the semiconductor substrate 6 as a terminal structure of a cell region, and defining the inside of the ring as the cell region; (c) forming the first silicon oxide film 10 on the inner surface of the trench 2; (d) after the step (c), forming the second silicon oxide film 13 on the entire surface of the semiconductor substrate 6 to bury the trench 2; (e) planarizing the second silicon oxide film 13 by using the silicon nitride film 7 as a stopper; and (f) removing the silicon nitride film 7, and then forming the third silicon oxide film 14 in a region in which the silicon nitride film 7 is removed. In the step (b), a trench region in which the semiconductor substrate surface is scattered in the shape of islands is formed as the trench 2. Since the semiconductor substrate surface is scattered in the shape of islands within the trench 2, over-polishing of the silicon oxide film 13 existing within the trench 2 can be prevented in the step (e).

The power semiconductor device according to this preferred embodiment exerts the following effects. The power semiconductor device according to this preferred embodiment includes the semiconductor substrate 6. The ring-shaped trench 2 is formed along the peripheral portion of the semiconductor substrate 6 as a terminal structure of a cell region, and the inside of the ring is defined as the cell region. The power semiconductor device further includes the first silicon oxide film 10 formed on the inner surface of the trench 2, the second silicon oxide film 13 formed on the first silicon oxide film 10 and buried in the trench 2, and the third silicon oxide film 14 formed on the surface of the semiconductor substrate 6 except the trench 2. The trench 2 is formed as a trench part in which the surface of the semiconductor substrate 6 is scattered in the shape of islands. Thereby, in the step of burying the second silicon oxide film 13 in the trench 2, over-polishing of the silicon oxide film 13 existing within the trench 2 can be prevented.

The semiconductor substrate 6 is an Si substrate or an SiC substrate. Use of either of the substrates can exert the effects of the present invention described above.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a power semiconductor device, comprising the steps of:
    (a) forming a silicon nitride film on a semiconductor substrate;
    (b) after said step (a), forming a ring-shaped trench along a peripheral portion of said semiconductor substrate as a terminal structure of a cell region, and defining the inside of the ring as said cell region;
    (c) forming a first silicon oxide film on an inner surface of said trench;
    (d) after said step (c), forming a second silicon oxide film on an entire surface of said semiconductor substrate to bury said trench;

(e) planarizing said second silicon oxide film by using said silicon nitride film as a stopper; and (f) removing said silicon nitride film, and then forming a third silicon oxide film in a region in which said silicon nitride film is removed, wherein said third silicon oxide film is formed by thermal oxidation.

2. The method of manufacturing a power semiconductor device according to claim 1, wherein said step (a) is a step of forming said silicon nitride film on an Si substrate or an SiC substrate which serves as said semiconductor substrate.

3. The method of manufacturing a power semiconductor device according to claim 1, wherein said step (b) is a step of forming, as said trench, a trench region in which a surface of said semiconductor substrate is scattered in the shape of islands.

4. A power semiconductor device comprising:

a semiconductor substrate in which a ring-shaped trench is formed along a peripheral portion of said semiconductor substrate as a terminal structure of a cell region, the inside of the ring being defined as said cell region;

a first silicon oxide film formed on an inner surface of said trench;

a second silicon oxide film formed on said first silicon oxide film and buried in said trench in such a manner that said first silicon oxide film and said second silicon oxide film completely fill said trench; and a third silicon oxide film formed on a surface of said semiconductor substrate except said trench, wherein said trench is formed as a trench part in which the surface of said semiconductor substrate is scattered in the shape of islands.

5. The power semiconductor device according to claim 4, wherein said semiconductor substrate is an Si substrate or an SiC substrate.

* * * * *